(12) United States Patent
Kobayashi (10) Patent No.: US 10,004,140 B2
(45) Date of Patent: Jun. 19, 2018

(54) THREE-DIMENSIONAL CIRCUIT SUBSTRATE AND SENSOR MODULE USING THREE-DIMENSIONAL CIRCUIT SUBSTRATE

(71) Applicant: PANASONIC INTELLECTUAL PROPERTY MANAGEMENT CO., LTD., Osaka (JP)

(72) Inventor: Mitsuru Kobayashi, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days. days.

(21) Appl. No.: 15/518,797

(22) PCT Filed: Oct. 2, 2015

(86) PCT No.: PCT/JP2015/005028
§ 371 (c)(1),
(2) Date: Apr. 13, 2017

(87) PCT Pub. No.: WO2016/063466
PCT Pub. Date: Apr. 28, 2016

(65) Prior Publication Data
US 2017/0238415 A1 Aug. 17, 2017

(30) Foreign Application Priority Data
Oct. 24, 2014 (JP) ................................ 2014-217581

(51) Int. Cl.
*H05K 1/14* (2006.01)
*H05K 1/02* (2006.01)
(Continued)

(52) U.S. Cl.
CPC ............ *H05K 1/0284* (2013.01); *G01S 17/08* (2013.01); *G01V 8/12* (2013.01); *H05K 2201/10378* (2013.01)

(58) Field of Classification Search
CPC ....... H05K 1/0284; H05K 2201/10378; G01V 8/12; G01S 17/08
(Continued)

(56) References Cited

U.S. PATENT DOCUMENTS 4,591,220 A 5/1986 Impey
5,914,534 A 6/1999 Todd et al.
(Continued)

FOREIGN PATENT DOCUMENTS

| JP | 03-145790 | 6/1991 |
| JP | 2011-9438 | 1/2011 |
| JP | 2012-150022 | 8/2012 |

OTHER PUBLICATIONS

Search Report issued in International Bureau of WIPO Patent Application No. PCT/JP2015/005028, dated Dec. 22, 2015.
(Continued)

*Primary Examiner* — Sherman Ng
(74) *Attorney, Agent, or Firm* — Greenblum & Bernstein, P.L.C.

(57) ABSTRACT

A three-dimensional circuit substrate according to the present disclosure includes a base body and a wiring pattern formed on an outer surface of the base body. Also, the outer surface of the base body includes a mounting surface which faces the substrate when the three-dimensional circuit substrate is mounted onto the substrate, and an installation surface which is different from the mounting surface and is a surface where an electronic component is installable. Further, a recess is formed on a side where the mounting surface is provided in the base body.

18 Claims, 7 Drawing Sheets

(51) Int. Cl.
*G01V 8/12* (2006.01)
*G01S 17/08* (2006.01)

(58) Field of Classification Search
USPC .......................................... 361/784
See application file for complete search history.

(56) References Cited

U.S. PATENT DOCUMENTS

| | | | |
|---|---|---|---|
| 2005/0168961 A1* | 8/2005 | Ono | H01L 23/5385 361/784 |
| 2005/0260867 A1* | 11/2005 | Ono | H05K 1/144 439/65 |
| 2006/0183358 A1 | 8/2006 | Iida et al. | |
| 2013/0063415 A1 | 3/2013 | Shenoy et al. | |
| 2013/0292705 A1 | 11/2013 | Makimura et al. | |
| 2015/0287704 A1 | 10/2015 | Makimura et al. | |

OTHER PUBLICATIONS

The Extended European Search Report dated Oct. 20, 2017 for the related European Patent Application No. 15852745.7.

* cited by examiner

THREE-DIMENSIONAL CIRCUIT SUBSTRATE AND SENSOR MODULE USING THREE-DIMENSIONAL CIRCUIT SUBSTRATE

This application is a U.S. national stage application of the PCT International Application No. PCT/JP2015/005028 filed on Oct. 2, 2015, which claims the benefit of foreign priority of Japanese patent application 2014-217581 filed on Oct. 24, 2014, the contents of which are incorporated herein by reference in their entireties.

TECHNICAL FIELD

The present disclosure relates to a three-dimensional circuit substrate and a sensor module using the three-dimensional circuit substrate.

BACKGROUND ART

Conventionally, a sensor mounted onto a substrate, such as a proximity sensor, has been known (for example, refer to PTL 1).

According to PTL 1, a light receiver and a light emitter are arranged side by side in a circuit substrate, and a first translucent member and a second translucent member are covered with a light shielding member while the light receiver is covered with the first translucent member and the light emitter is covered with the second translucent member, so that a proximity sensor is mounted onto the substrate.

CITATION LIST

Patent Literature

PTL 1: Unexamined Japanese Patent Publication No. 2012-150022

SUMMARY OF THE INVENTION

A three-dimensional circuit substrate according to the present disclosure is a three-dimensional circuit substrate which is formed so as to be mountable onto a substrate, and includes a base body and a wiring pattern formed on an outer surface of the base body. Then, the outer surface of the base body includes a mounting surface which faces the substrate when the three-dimensional circuit substrate is mounted onto the substrate, and an installation surface which is different from the mounting surface and is a surface where an electronic component is installable. Further, a recess is formed on a side where the mounting surface is provided in the base body.

Also, a sensor module according to the present disclosure uses the above-described three-dimensional circuit substrate.

DESCRIPTION OF EMBODIMENTS

Prior to description of exemplary embodiments, problems in the above-described conventional technique will be described.

According to the conventional technique, in mounting an additional electronic component onto a substrate, an additional electronic component needs to be mounted onto a portion in the substrate, other than a portion where a proximity sensor is mounted in a plan view. For this reason, the above-described conventional technique has difficulties in effectively using a mounting space in a substrate.

Thus, it is an object of the present disclosure to obtain a three-dimensional circuit substrate which allows for more effective use of a mounting space in a substrate, and a sensor module using the three-dimensional circuit substrate.

Hereinafter, the exemplary embodiments of the present disclosure will be described in detail with reference to the drawings. It should be noted that, in the following description, an example of a three-dimensional circuit substrate used in forming a sensor module will be described. Further, a proximity sensor mounted onto a portable terminal will be described as an example of a sensor module.

Further, the following exemplary embodiments will include structural elements which are similar to each other. Accordingly, in the following description, similar structural elements will be denoted by the same reference marks, and duplicated description will be avoided.

First Exemplary Embodiment

A sensor module according to a first exemplary embodiment will be described with reference to FIG. 1 to FIG. 6.

Figure 1:
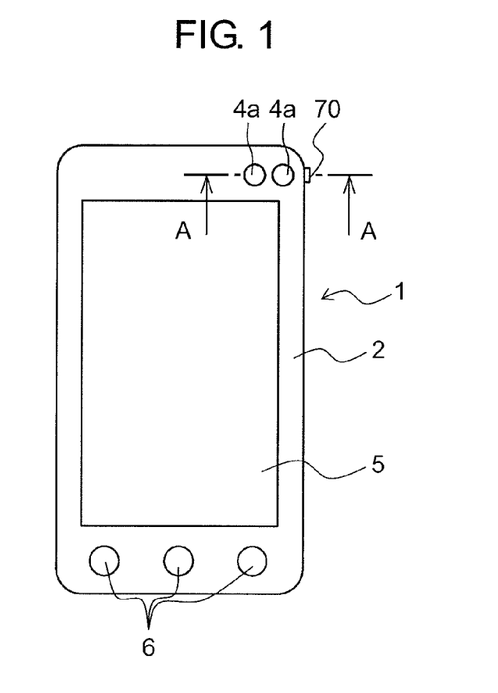
FIG. 1 is a plan view schematically showing a portable terminal onto which a sensor module according to a first exemplary embodiment is mounted.

Sensor module 10 according to the present exemplary embodiment is mounted onto portable telephone (portable terminal) 1, as shown in FIG. 1.

Figure 2:
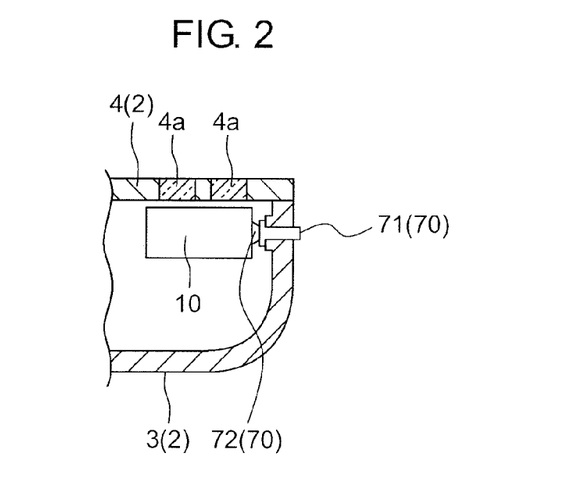
FIG. 2 is a cross-sectional view taken along line A-A in FIG. 1.

Portable telephone 1 is generally called a smartphone which can be operated by a touch of a fingertip, a dedicated pen, or the like on a screen. Portable telephone 1 includes sensor module 10 and casing 2 which accommodates sensor module 10, as shown in FIG. 2.

According to the present exemplary embodiment, casing 2 includes a box-shaped base 3 having one open end, and cover 4 which is attached so as to block the open end of base 3. Then, sensor module 10, circuit substrate (substrate) 80 shown in FIG. 4, and the like are disposed in an internal space formed by base 3 and cover 4 being bonded to each other. On a front surface of cover 4 (a surface opposite to a surface which faces sensor module 10), display unit 5 serving as a screen, a plurality of operation buttons 6, and the like are formed.

Also, switch 70, by which a power source is turned on or off and the like, is formed near sensor module 10 of portable telephone 1. Switch 70 is attached to casing 2, for example. Switch 70 can be formed of operation element 71 which can be pressed against an inner side of casing 2, and a switch part 72 by which a power source is turned on or off upon a press of operation element 71. According to the present exemplary embodiment, switch part 72 is attached to sensor module 10, so that switch 70 is formed near sensor module 10.

Figure 4:
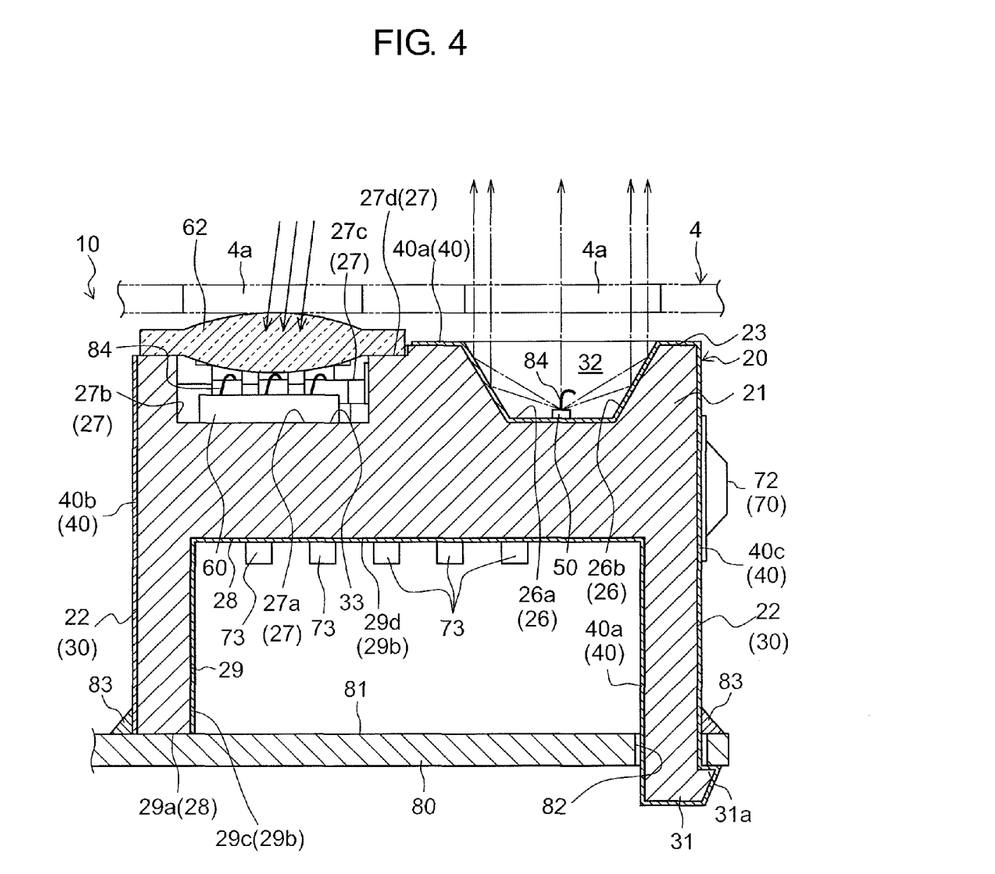
FIG. 4 is a cross-sectional view schematically showing the sensor module according to the first exemplary embodiment.

As shown in FIG. 4, sensor module 10 is formed by using three-dimensional circuit substrate 20 which is formed so as to be mountable onto circuit substrate (substrate) 80.

Specifically, light-emitting-diode (LED) element (first photoelectric conversion element: sensor element) 50 which is a light emitting element to be described later, light receiving element (second photoelectric conversion element: sensor element) 60 to be described later, and the like are mounted onto an upper surface of three-dimensional circuit substrate 20, so that sensor module 10 functions as a proximity sensor.

Three-dimensional circuit substrate 20 includes base body 21 and wiring pattern 40. According to the present exemplary embodiment, base body 21 is formed by using a material such as a resin or ceramic, and is formed into a shape of a rectangular parallelepiped having a relatively large thickness. It is noted that the base body 21 includes a recess part and the like, and thus is not an exact rectangular parallelepiped.

Then, according to the present exemplary embodiment, as shown in FIG. 4, a lower surface (a part of outer surface 22) of base body 21 serves as mounting surface 28 which faces front surface 81 of circuit substrate (substrate) 80 when three-dimensional circuit substrate 20 is mounted onto circuit substrate (substrate) 80. On the other hand, an upper surface (a part of outer surface 22: a surface different from mounting surface 28) of base body 21 is installation surface 23 where electronic components such as LED element 50 or light receiving element 60 are disposed. In this manner, according to the present exemplary embodiment, installation surface 23 and mounting surface 28 overlap each other as viewed from a thickness direction of circuit substrate 80.

Figure 3:
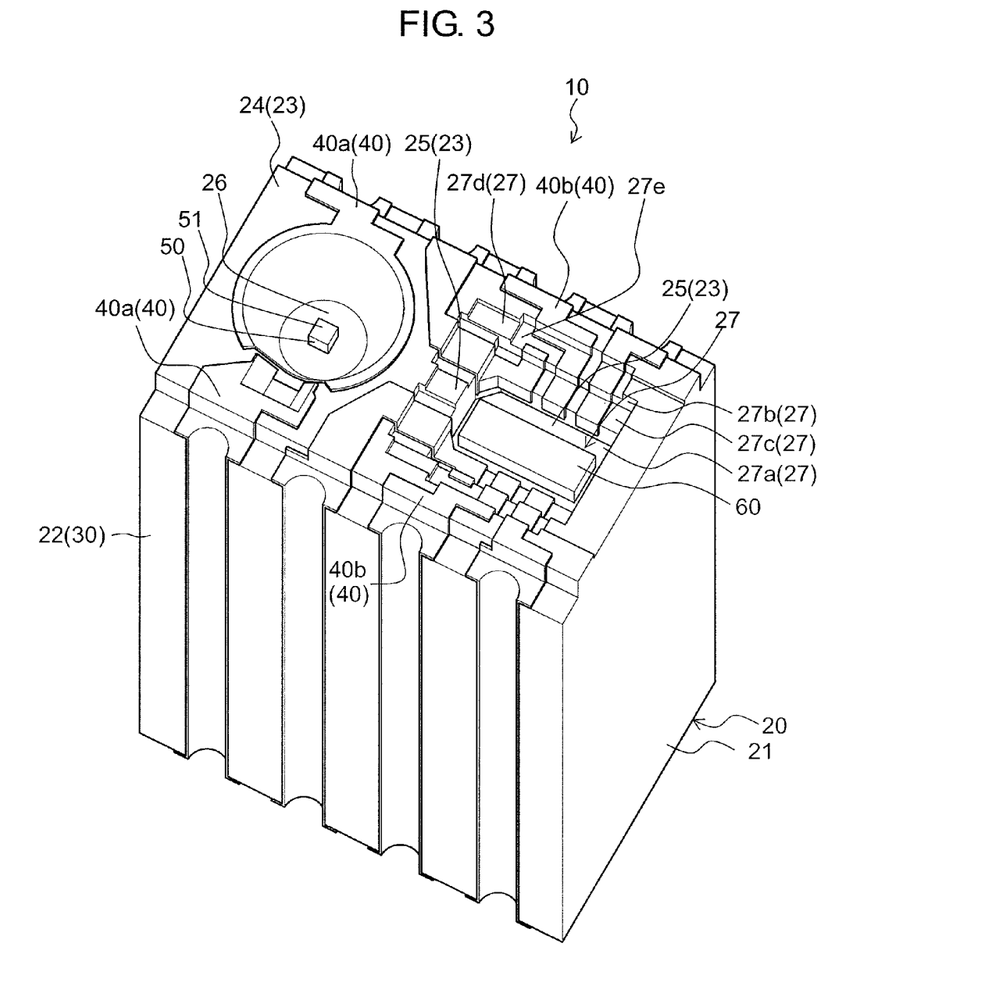
FIG. 3 is a perspective view schematically showing the sensor module according to the first exemplary embodiment.

Further, according to the present exemplary embodiment, as shown in FIG. 3, installation surface 23 has a three-dimensional shape formed of outer front surface 24 and inner front surface 25 connected with outer front surface 24. In other words, base body 21 has a three-dimensional solid shape with a recess part.

Specifically, inner front surface 25 includes LED-element-disposed inner surface 26 where LED element (first photoelectric conversion element) 50 is disposed, and light-receiving-element-disposed inner surface 27 where light receiving element (second photoelectric conversion element) 60 is disposed.

LED-element-disposed inner surface 26 includes bottom surface 26a and side surface 26b, and bottom surface 26a and side surface 26b define LED-element-disposed recess part 32.

On the other hand, light-receiving-element-disposed inner surface 27 includes bottom surface 27a, side surface 27b, first stepped surface 27c connected with bottom surface 27a via side surface 27b, and second stepped surface 27d connected with bottom surface 27a or first stepped surface 27c via side surface 27b. Then, bottom surface 27a, side surface 27b, first stepped surface 27c, and second stepped surface 27d define light-receiving-element-disposed recess part (recess part) 33. Besides, recessed surface 27e is formed on second stepped surface 27d.

LED-element-disposed recess part 32 is upwardly open, and has an approximately truncated-conical shape of which a diameter increases toward the top. Light-receiving-element-disposed recess part 33 is formed in a shape of a step where an upper portion has a larger width.

In this manner, according to the present exemplary embodiment, the base body 21 has a three-dimensional solid shape including LED-element-disposed recess part 32 and light-receiving-element-disposed recess part 33 which are defined by inner front surface 25.

Because base body 21 is formed so as to have a relatively large thickness as described above, LED element 50 and light receiving element 60 which are mounted onto the upper surface (installation surface 23) can be disposed near windows 4a of cover 4. To dispose LED element 50 and light receiving element 60 near windows 4a of cover 4 would prevent dirt or the like on windows 4a from being erroneously determined to be irradiated object 90 when sensor module 10 functions as a proximity sensor.

Meanwhile, in a case where base body 21 having a relatively large thickness is used in order to improve the function of the proximity sensor, if the lower surface of base body 21 which serves as mounting surface 28 is formed so as to be flat, an additional electronic component or the like cannot be mounted onto a portion where base body 21 is present when three-dimensional circuit substrate 20 is mounted onto circuit substrate 80. Accordingly, a mounting space in circuit substrate 80 cannot be effectively used.

Thus, in the present exemplary embodiment, a mounting space in circuit substrate 80 can be more effectively used.

Specifically, as shown in FIG. 4, recess 29 is formed on a side where mounting surface 28 is provided in base body 21, and a space where an additional electronic component can be mounted is formed below installation surface 23 when three-dimensional circuit substrate 20 is mounted onto circuit substrate 80.

As a result of recess 29 being formed on a side where mounting surface 28 is provided in base body 21 as described above, the lower surface (mounting surface 28) of base body 21 includes outer front surface 29a and inner front surface 29b of recess 29. Then, inner front surface 29b includes inner side surface 29c and top surface (innermost surface) 29d. According to the present exemplary embodiment, when three-dimensional circuit substrate 20 is mounted onto circuit substrate (substrate) 80, a space having substantially no clearance is formed by inner front surface 29b and front surface 81 of circuit substrate (substrate) 80. In other words, a space which is formed by recess 29 when three-dimensional circuit substrate 20 is mounted onto circuit substrate (substrate) 80 is an enclosed space.

Also, wiring pattern 40 in a three-dimensional shape is formed in outer surface 22 of base body 21, and wiring pattern 40 and base body 21 form three-dimensional circuit substrate 20. Wiring pattern 40 is formed directly in outer surface 22 of base body 21 by molded interconnect devices (MID) technology. In this regard, MID means a three-dimensional molded circuit component in which an electric circuit is integrally formed in a front surface of a three-dimensional molded article such as an injection-molded article. By utilizing MID technology, unlike a conventional two-dimensional circuit, a circuit can be added to an inclined surface, a vertical surface, a curved surface, a through hole in a molded piece, or the like.

It is noted that, for MID, microscopic integrated processing technology (MIPTEC, registered trademark) which is disclosed particularly in Unexamined Japanese Patent Publication No. 2008-159942 (paragraphs 0002-0003) and Unexamined Japanese Patent Publication No. 2011-134777 (paragraph 0003), can be used. According to MIPTEC (registered trademark), by using a molded-surface activating technique, a laser patterning technique, and the like for MID technology for forming an electric circuit in a front surface of an injection-molded article, it is possible to implement a three-dimensional (3D) mounting device in which fine patterning and bare-chip mounting can be achieved.

Wiring pattern 40 includes LED-element wiring pattern 40a to which LED element 50 is electrically connected, and light-receiving-element wiring pattern 40b to which light receiving element 60 is electrically connected.

LED-element wiring pattern 40a includes two LED-element wiring patterns 40a which serve as a positive electrode and a negative electrode, respectively. One of LED-element wiring patterns 40a is formed so as to have a three-dimensional shape with which entire LED-element-disposed inner surface 26 is covered. Then, in the other of LED-element wiring patterns 40a, a portion formed in LED-element-disposed inner surface 26 is furnished with a function of a reflector. To furnish the function of the reflector to LED-element-disposed recess part 32 where LED element 50 is disposed can allow light to be emitted more widely from LED element 50 without using a lens or the like. As described above, side surface 26b of LED-element-disposed inner surface 26 has a shape corresponding to a side surface of a truncated cone in the present exemplary embodiment. However, side surface 26b may have any of various shapes such as a paraboloidal shape. Preferably, side surface 26b is designed so as to have a suitable shape in accordance with light emission range which is set in advance.

On the other hand, there is formed a plurality of light-receiving-element wiring patterns 40b. Then, each of light-receiving-element wiring patterns 40b is formed so as to have a stepped shape (a three-dimensional shape) along light-receiving-element-disposed recess part 33 which has a stepped shape. At this time, in light-receiving-element wiring patterns 40b, all portions formed on second stepped surface 27d are located in recessed surface 27e. In other words, none of light-receiving-element wiring patterns 40b is formed in a portion other than recessed surface 27e in second stepped surface 27d. Recessed surface 27e is formed so as to have a depth larger than a thickness of each of light-receiving-element wiring patterns 40b, so that light-receiving-element wiring patterns 40b do not protrude upwardly from any portion other than recessed surface 27e in second stepped surface 27d.

Also, LED-element wiring patterns 40a and light-receiving-element wiring patterns 40b are formed so as to extend from inner front surface 25 to outer front surface 24 of base body 21. Specifically, each portion of wiring pattern 40 formed in inner front surface 25 is extended from the upper surface (installation surface 23) to the lower surface (mounting surface 28) of base body 21, passing through the side surface (outer side surface 30) (refer to FIG. 3 and FIG. 4). As a result of wiring pattern 40 being extended from inner front surface 25 to the lower surface (mounting surface 28) of base body 21, base body 21 can be mounted directly onto an electronic device such as a portable telephone (a photoelectric conversion element in a recess part can be electrically connected to circuit substrate 80 of an electronic device).

Also, as shown in FIG. 4, wiring pattern 40 is formed also in inner front surface 29b of recess 29. That is, according to the present exemplary embodiment, wiring pattern 40 is formed in installation surface 23 and inner front surface 29b of recess 29.

As a result of wiring pattern 40 being formed in inner front surface 29b of recess 29 as described above, additional electronic component 73 can be mounted so as to be electrically connected to wiring pattern 40. According to the present exemplary embodiment, electronic component 73 such as a capacitor or a resistor for suppressing a noise or the like which occurs in the proximity sensor is mounted onto top surface (innermost surface) 29d when sensor module 10 functions as a proximity sensor, so that electronic component 73 is electrically connected to wiring pattern 40 formed in top surface (innermost surface) 29d.

Further, according to the present exemplary embodiment, as shown in FIG. 4, switching wiring pattern 40c is formed on outer side surface 30 of base body 21, more particularly, on a portion of outer side surface 30, which is located at a side close to LED element 50 in a direction where LED element 50 and light receiving element 60 are arranged side by side. Then, switch part 72 of switch 70 is mounted onto outer side surface 30 so as to be electrically connected to switching wiring pattern 40c.

As described above, according to the present exemplary embodiment, switch part 72 is mounted onto the side surface (outer side surface 30) of base body 21 by effectively using base body 21 having a large thickness.

Meanwhile, when switch part 72 is mounted onto the side surface (outer side surface 30) of base body 21, three-dimensional circuit substrate 20 is pressed by switch part 72 during operation of switch 70 if three-dimensional circuit substrate 20 is mounted onto circuit substrate 80 only by using solder 83. This may cause faulty connection between three-dimensional circuit substrate 20 and circuit substrate 80. In view of this, according to the present exemplary embodiment, fitting protrusion (fitting part) 31 which protrudes downward (toward circuit substrate 80) is formed in base body 21, and fitting protrusion 31 is fitted into a fitting hole (fitted part) 82 formed in circuit substrate 80. At this time, hook 31a of fitting protrusion 31 is caused to catch circuit substrate 80, and fitting protrusion 31 is fitted into fitting hole (fitted part) 82.

Further, according to the present exemplary embodiment, wiring pattern 40 is formed also in fitting protrusion (fitting part) 31, and wiring pattern 40 is soldered to circuit substrate 80, so that base body 21 is more firmly fixed (mounted) to circuit substrate 80.

Another configuration in which three-dimensional circuit substrate 20 is mounted onto circuit substrate 80 only by using solder 83 is practicable. Also, in a case where switch part 72 is not mounted onto the side surface (outer side surface 30) of base body 21, both of a configuration in which a fitting part is provided and a configuration in which mounting is achieved only by using solder 83 are practicable.

As described above, sensor module 10 includes LED element (first photoelectric conversion element: sensor element) 50 as an electronic component which is mounted onto recess part 32 of base body 21 and is electrically connected to wiring pattern 40 (LED-element wiring patterns 40a).

LED element 50 is a light emitting element including light emitting part 51 as shown in FIG. 3, and a known one can be used. For example, as light emitting part 51, an infrared light emitting diode (LED), which is supplied with an electric current from a sensor controller (not shown) to emit infrared rays, can be used.

Then, LED element 50 is electrically connected to LED-element wiring patterns 40*a* via bonding wire 84 as shown in FIG. 4. Specifically, with LED element 50 being mounted onto one of LED-element wiring patterns 40*a*, LED element 50 is connected to the other of LED-element wiring patterns 40*a* via bonding wire 84. Consequently, two LED-element wiring patterns 40*a* which serve as a positive electrode and a negative electrode, respectively, are electrically connected to each other via LED element 50 and bonding wire 84.

Further, sensor module 10 includes the second photoelectric conversion element as an electronic component which is mounted onto light-receiving-element-disposed recess part 33 of base body 21 (a portion of base body 21, other than a portion where the first photoelectric conversion element is mounted), and is electrically connected to wiring pattern 40 (light-receiving-element wiring patterns 40*b*). It is noted that, in the present exemplary embodiment, LED element 50 is used as the first photoelectric conversion element.

Figure 5A:
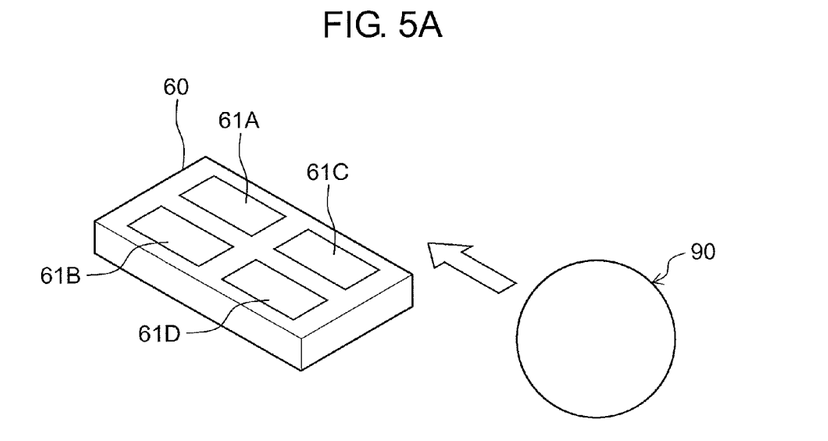
FIG. 5A is a perspective view for describing a relationship between a light receiving element and an irradiated object according to the first exemplary embodiment.

Further, light receiving element 60 is used as the second photoelectric conversion element. As shown in FIG. 5A, light receiving element 60 includes light receiving parts 61A to 61D receiving light which is emitted from LED element 50 and is reflected by irradiated object 90. Thus, in the present exemplary embodiment, second photoelectric conversion element 60 is different in kind from LED element (first photoelectric conversion element) 50.

Each of light receiving parts 61A to 61D receives infrared rays which are emitted from light emitting part 51 and are reflected by irradiated object 90 such as a hand, a finger, or a face of a user, and generates an electric current in accordance with an amount of received light through photoelectric conversion. The generated electric current is output to analog-digital (AD) converter (not shown) or the like.

As light receiving element 60 described above, a known light receiving element can be used. For example, light emitting element 60 can be formed by using a semiconductor substrate. Then, a photodiode which is formed by provision of a pn-junction area at a predetermined depth in a semiconductor substrate can be used as each of light receiving parts 61A to 61D.

Light receiving element 60 is connected to each of light-receiving-element wiring patterns 40*b* by using a plurality of bonding wires 84, to be electrically connected to each of light-receiving-element wiring patterns 40*b*. It is noted that, in the present exemplary embodiment, bonding wires 84 are connected to portions of light-receiving-element wiring patterns 40*b*, which are formed on first stepped surface 27*c*.

Further, in the present exemplary embodiment, lens 62 is disposed in base body 21, and infrared rays reflected by irradiated object 90 are collected into light receiving parts 61A to 61D of light emitting element 60.

Lens 62 is disposed above light receiving element 60 so as to face light receiving element 60. Lens 62 is held at a predetermined distance from light receiving parts 61A to 61D of light emitting element 60. This allows light receiving element 60 to form an image from infrared rays.

As lens 62, a lens in which a lens matrix governing a function of collecting infrared rays is formed of Si having excellent transmittance of infrared rays, and a band-pass filter including an optical multilayer film which allows a wavelength around infrared rays to selectively pass through is formed in a surface of the lens matrix, can be used, for example.

Further, in the present exemplary embodiment, lens 62 includes a convex lens having two convex surfaces as shown in FIG. 4. It is noted that lens 62 may include a convex lens having one flat surface (upper surface) and the other convex surface (lower surface). Also, lens 62 may be formed of one recessed surface and the other convex surface which has a larger curvature than the recessed surface. That is, any lens that has a function of collecting light into light receiving element 60 can be used as lens 62. Also, a convex surface or a recessed surface may be a paraboloidal surface.

In the present exemplary embodiment, the periphery of lens 62 is placed on second stepped surface 27*d*, so that lens 62 is disposed on inner front surface 25 of base body 21. That is, second stepped surface 27*d* as inner front surface 25 is a lens placement surface where lens 62 is placed, and recessed surface 27*e* where wiring pattern 40 (light-receiving-element wiring patterns 40*b*) is formed is formed in second stepped surface 27*d*.

Consequently, lens 62 can be prevented from being inclined due to light-receiving-element wiring patterns 40*b* when lens 62 is placed on second stepped surface 27*d*. As a result, a predetermined distance between light receiving element 60 and lens 62 (a distance required for light receiving element 60 to form an image from infrared rays) can be maintained with high precision.

At this time, it is preferable that lens 62 be placed in base body 21 in a state of being positioned.

Sensor module 10 described above can be formed by the following method, for example.

First, base body 21 having a desired three-dimensional solid shape is formed by injection molding or the like (a first step).

Then, wiring pattern 40 having a desired three-dimensional shape is formed in installation surface 23, outer side surface 30, and mounting surface 28 of base body 21, by using MID technology (a second step).

Next, LED element 50 and light receiving element 60 are mounted onto inner front surface 25 of base body 21, and electronic component 73 is mounted onto wiring pattern 40 formed in top surface (innermost surface) 29*d* (a third step). It is noted that mounting can be performed in any order.

Subsequently, LED element 50 and light receiving element 60 are electrically connected to wiring pattern 40 by using bonding wire 84 (a fourth step).

Thereafter, lens 62 is placed on second stepped surface (lens placement surface) 27*d* of base body 21 (a fifth step).

Consequently, sensor module 10 shown in FIG. 3 and FIG. 4 is formed.

Sensor module 10 with the above-described configuration can be mounted onto an electronic device such as a portable telephone, as described above.

For example, when sensor module 10 is incorporated in a touch-panel portable telephone terminal, sensor module 10 is disposed near a liquid crystal display in the portable telephone terminal. In such a case where sensor module 10 is incorporated in a portable telephone terminal, it is preferable that translucent windows 4*a* formed on cover 4 be disposed above LED element 50 and light receiving element 60.

Then, in using such a portable telephone terminal, if irradiated object 90 is present near sensor module 10, the presence of irradiated object 90 can be recognized. Specifically, if irradiated object 90 is present near sensor module 10, infrared rays emitted from light emitting part 51 of LED element 50 pass through window 4*a* on a side where LED element 50 is provided (on a right side in FIG. 4), fall upon irradiate object 90, and are reflected by irradiated object 90.

Then, infrared rays reflected by irradiated object 90 pass through window 4a on a side where light receiving element 60 is provided (on a left side in FIG. 4), and are collected by lens 62, to be received by light receiving part 61A to 61D of light receiving element 60. In this way, as a result of infrared rays emitted from light emitting part 51 being received by light receiving parts 61A to 61D, the presence of irradiated object 90 near sensor module 10 can be recognized.

A function of recognizing irradiated object 90 is used in sensing a face (irradiated object 90) when the face is brought near an area around a liquid crystal display in order to make a call with a portable telephone terminal, for example. When sensor module 10 senses a face (irradiated object 90) and recognizes that a portable telephone terminal is in a call state, by disabling touch-panel operations which use a liquid crystal display or by bringing the liquid crystal display to an unlighted state, it is possible to prevent malfunction during a call and reduce power consumption in a battery.

Further, according to the present exemplary embodiment, as shown in FIG. 5A, four light receiving parts 61A to 61D are formed in light receiving element 60. Four light receiving parts 61A to 61D are arranged in such a manner that light receiving parts 61A, 61B are arranged side by side in a widthwise direction on one lengthwise side of light receiving element 60, and light receiving parts 61C, 61D are arranged side by side in the widthwise direction on the other lengthwise side. Because of such a configuration of light receiving element 60, also a direction of movement (direction of lateral movement) of irradiated object 90 located near sensor module 10 can be sensed. For example, in a case where irradiated object 90 moves in a direction indicated by an arrow in FIG. 5A, infrared rays reflected by irradiated object 90 are received by light receiving parts 61C, 61D, and thereafter, are received by light receiving parts 61A, 61B. Then, by sensing a change in an amount of received light in each of four light receiving parts 61A to 61D, it is possible to sense a direction of lateral movement of irradiated object 90.

A function of sensing a direction of movement of irradiated object 90 can be used in sensing a direction of movement of a finger (irradiated object) and scrolling web pages (Web pages) displayed on a liquid crystal display, for example.

Figure 5B:
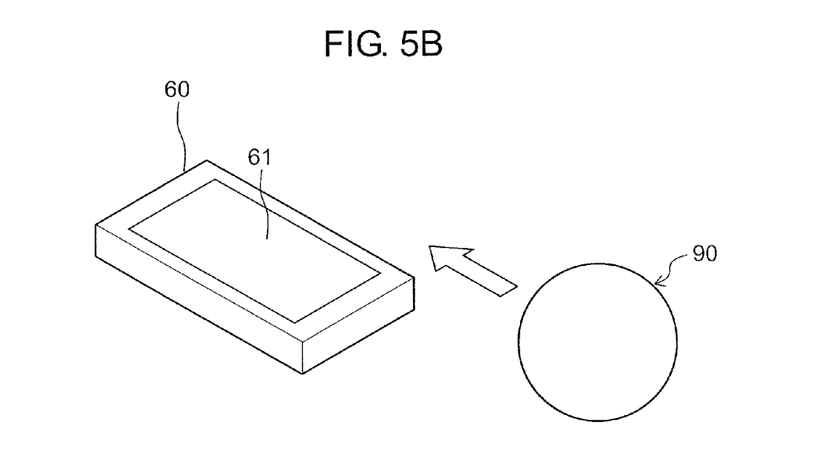
FIG. 5B is a perspective view for describing a relationship between a light receiving element and an irradiated object according to the first exemplary embodiment.

It should be noted that light receiving element 60 does not necessarily include four light receiving parts. For example, in a case where it is desired to furnish light receiving element 60 with a simple presence-recognition function, light receiving element 60 may include single light receiving part 61 as shown in FIG. 5B. Alternatively, the number of light receiving parts of light receiving element 60 may be two, three, or may be five or more. That is, there is no limit to the number of light receiving parts 61.

In this way, sensor module 10 according to the present exemplary embodiment functions as both of a proximity sensor and a gesture sensor.

As described above, three-dimensional circuit substrate 20 according to the present exemplary embodiment is three-dimensional circuit substrate 20 which is formed so as to be mountable onto circuit substrate (substrate) 80. Also, three-dimensional circuit substrate 20 includes base body 21 and wiring pattern 40 formed in outer surface 22 of base body 21.

Further, outer surface 22 of base body 21 includes mounting surface 28 which faces circuit substrate (substrate) 80 when three-dimensional circuit substrate 20 is mounted onto circuit substrate (substrate) 80, and installation surface 23 which is different from mounting surface 28 and is a surface where electronic components (LED element 50 and light receiving element 60) are installable.

Moreover, recess 29 is formed on a side where mounting surface 28 is provided in base body 21.

In three-dimensional circuit substrate 20 according to the present exemplary embodiment, recess 29 is formed on the side where mounting surface 28 is provided in base body 21 as described above, so that a space where an additional electronic component can be disposed is formed below installation surface 23 when three-dimensional circuit substrate 20 is mounted onto circuit substrate 80. Therefore, it is possible to more effectively use a mounting space in circuit substrate (substrate) 80.

Figure 6:
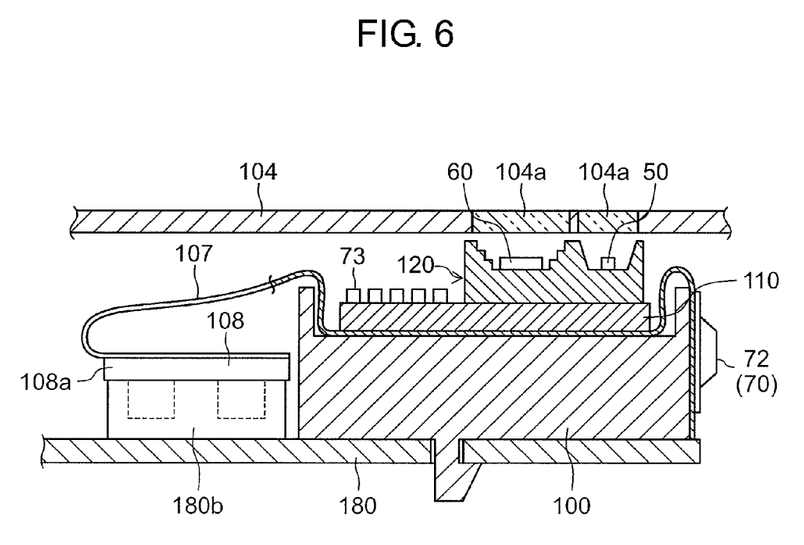
FIG. 6 is a cross-sectional view schematically showing a sensor module according to a comparative example.

For example, a configuration of a sensor module shown in FIG. 6 can be considered.

Specifically, as shown in FIG. 6, sensor 120 and additional electronic component 73 are mounted onto a central portion of flexible substrate 107 with single circuit substrate 110 being interposed therebetween. Then, switch part 72 is mounted onto one end of flexible substrate 107, and header 108a of dedicated connector 108 is mounted onto the other end.

While single circuit substrate 110 is placed on spacer 100, switch part 72 is disposed on a side surface of spacer 100, and header 108a of dedicated connector 108 is fitted into socket 180b mounted onto circuit substrate 180. Thus, sensor 120, additional electronic component 73, and switch part 72 are electrically connected to circuit substrate 180. It is noted that spacer 100 is used for disposing switch part 72 and for disposing LED element 50 and light receiving element 60 of sensor 120 near windows 104a of cover 104.

In the configuration shown in FIG. 6, additional electronic component 73 is present in a portion other than a portion where sensor 120 is mounted, in a plan view. Accordingly, circuit substrate 180 cannot be effectively used. Also, a mounting space for mounting sensor 120 and additional electronic component 73 is required, so that circuit substrate 180 cannot be downsized. Further, use of dedicated connector 108 and flexible substrate 107 increases the number of components. Moreover, also a space where dedicated connector 108 is mounted needs to be reserved, which further increases the size of circuit substrate 180. Also, because of use of flexible substrate 107 and dedicated connector 108 which are relatively expensive, a manufacturing cost is increased.

In contrast, by using three-dimensional circuit substrate 20 according to the present exemplary embodiment, a cost, as well as the number of components, can be reduced. Also, a mounting space in circuit substrate (substrate) 80 can be more effectively used, so that downsizing of circuit substrate 80 can be promoted. As a result, an electronic device (such as a portable telephone terminal) containing circuit substrate 80 can be downsized. Further, in a case where the size of an electronic device (such as a portable telephone terminal) is unchanged, a space other than a portion where circuit substrate 80 is contained is increased, so that more other members can be disposed correspondingly. For example, a larger battery can be contained in an increased space, which improves the performance of an electronic device (such as a portable telephone terminal).

Further, according to the present exemplary embodiment, wiring pattern 40 is formed in installation surface 23 and inner front surface 29b of recess 29, so that additional electronic component 73 can be mounted onto three-dimensional circuit substrate 20. To dispose an electronic component also on the lower surface side of three-dimensional circuit substrate 20 can reduce the widthwise size of three-dimensional circuit substrate 20.

Also, according to the present exemplary embodiment, base body 21 includes fitting protrusion (fitting part) 31 which is formed so as to be fittable into a fitting hole (fitted part) 82 formed in circuit substrate (substrate) 80.

As a result of fitting protrusion (fitting part) 31 of base body 21 being fitted into fitting hole (fitted part) 82 of circuit substrate (substrate) 80, three-dimensional circuit substrate 20 can be more firmly mounted onto circuit substrate (substrate) 80. Therefore, even in a case where a force is externally applied to three-dimensional circuit substrate 20, such as a case where switch part 72 is attached to outer side surface 30 of base body 21, the occurrence of faulty connection between three-dimensional circuit substrate 20 and circuit substrate (substrate) 0.80 can be suppressed.

Besides, in a case where switch part 72 is attached to outer side surface 30 of base body 21, it is preferable to avoid formation of recess 29 in a portion of base body 21, which comes into contact with a portion mainly subjected to application of an external force in switch part 72 during an operation of switch 70, as shown in FIG. 4. Consequently, a portion to which Sa force is applied by switch part 72 is solid, so that base body 21 can be prevented from deforming due to an operation of switch 70.

Also, according to the present exemplary embodiment, wiring pattern 40 which is to be soldered to circuit substrate (substrate) 80 is formed in fitting protrusion (fitting part) 31. Consequently, not only fixation by fitting, but also fixation by solder 83, can be achieved, so that three-dimensional circuit substrate 20 can be still more firmly mounted onto circuit substrate (substrate) 80.

Also, according to the present exemplary embodiment, installation surface 23 and mounting surface 28 overlap each other as viewed from a thickness direction of circuit substrate (substrate) 80. Consequently, the widthwise size of three-dimensional circuit substrate 20 can be further reduced. In particular, by providing a configuration in which almost all of installation surface 23 and almost all of mounting surface 28 overlap each other as viewed from the thickness direction of circuit substrate (substrate) 80, it is possible to suppress formation of a useless mounting space as viewed from the thickness direction of circuit substrate (substrate) 80, so that the widthwise downsizing of three-dimensional circuit substrate 20 can be more effectively promoted.

Further, by forming sensor module 10 by using three-dimensional circuit substrate 20 described above, sensor module 10 can allow for more effective use of a mounting space in circuit substrate (substrate) 80.

Second Exemplary Embodiment

Next, a sensor module according to a second exemplary embodiment will be described with reference to FIG. 7.

Sensor module 10A according to the present exemplary embodiment basically has a configuration almost identical to that of sensor module 10 described in the above-described first exemplary embodiment. With regard to sensor module 10A according to the second exemplary embodiment, which is shown in FIG. 7, identical reference marks will be given to elements similar to those in sensor module 10 according to the first exemplary embodiment described with reference to FIG. 4, and description about those elements will be omitted occasionally.

Figure 7:
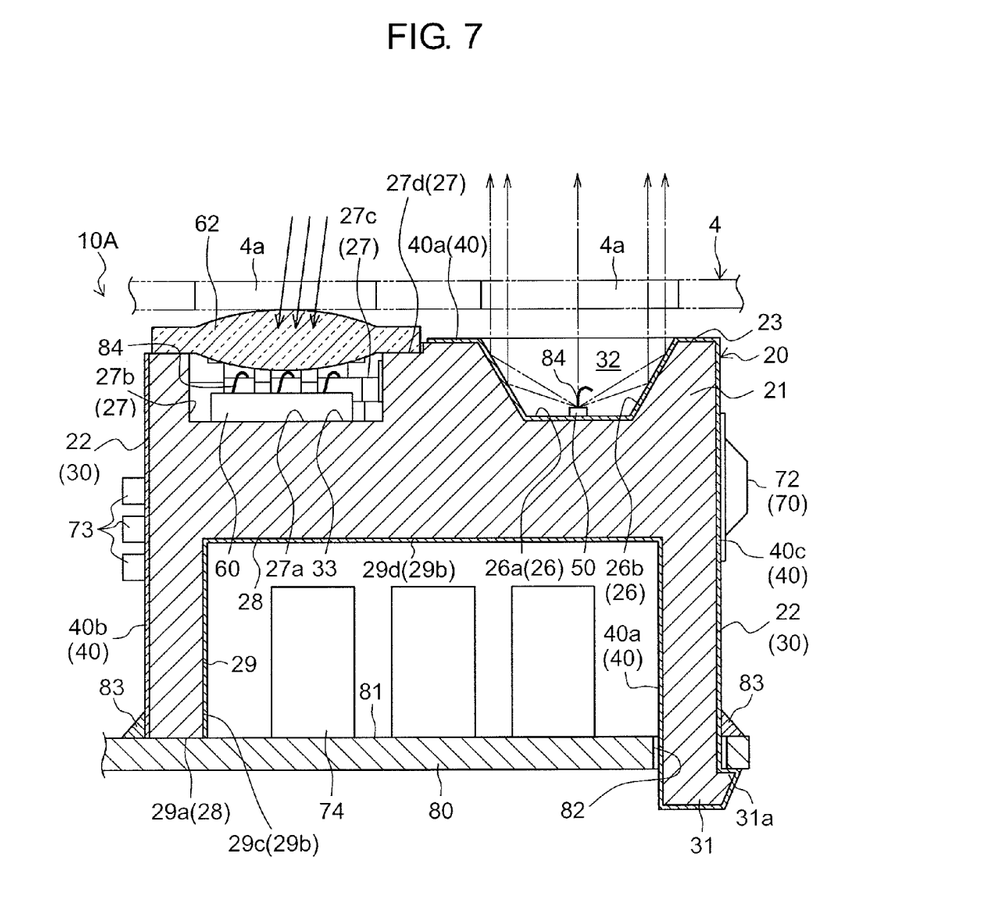
FIG. 7 is a cross-sectional view schematically showing a sensor module according to a second exemplary embodiment.

Sensor module 10A is formed by using three-dimensional circuit substrate 20 which is formed so as to be mountable onto circuit substrate (substrate) 80, as shown in FIG. 7.

Specifically, LED element (first photoelectric conversion element: sensor element) 50, light receiving element (second photoelectric conversion element: sensor element) 60, or the like is mounted onto an upper surface of three-dimensional circuit substrate 20, so that sensor module 10 functions as a proximity sensor.

Also, three-dimensional circuit substrate 20 includes base body 21 which has a three-dimensional solid shape including a recess part, and wiring pattern 40 formed on outer surface 22 of base body 21.

Then, outer surface 22 of base body 21 includes mounting surface 28 which faces circuit substrate (substrate) 80 when three-dimensional circuit substrate 20 is mounted onto circuit substrate (substrate) 80, and installation surface 23 which is different from mounting surface 28 and is a surface where an electronic component (LED element 50 or light receiving element 60) is installable.

Further, recess 29 is formed on a side where mounting surface 28 is provided in base body 21, and wiring pattern 40 is formed in installation surface 23 and inner front surface 29b of recess 29.

In this regard, in sensor module 10A according to the present exemplary embodiment, additional electronic component 73 is mounted onto outer side surface 30 of base body 21. Then, electronic component 74 which is different in kind from additional electronic component 73 is mounted directly onto a wiring pattern (not shown) of circuit substrate 80 in a space formed by recess 29. According to the present exemplary embodiment, electronic component 74 which is relatively tall is mounted directly onto a wiring pattern (not shown) of circuit substrate 80 in recess 29.

The above-described present exemplary embodiment can produce effects and advantages which are similar to those in the above-described first exemplary embodiment.

Also, electronic component 74 which is different in kind from additional electronic component 73 is mounted directly onto a wiring pattern (not shown) of circuit substrate 80 in a space formed by recess 29. Accordingly, electronic component 74, which is supposed to be mounted onto circuit substrate 80 outside a sensor module, can be mounted onto a portion where sensor module 10A is mounted in circuit substrate 80. As a result, circuit substrate 80 can be further downsized.

At this time, it is preferable that wiring pattern 40 is formed in almost all of outer side surface 30 of base body 21. In other words, it is preferable that wiring pattern 40 is formed in almost all of outer side surface 30 so far as a function of wiring pattern 40 where LED element 50, light receiving element 60, or additional electronic component 73 is mounted is not impaired. This can improve shield effects produced by wiring pattern 40 formed in outer side surface 30.

Besides, while electronic component 74 is being mounted directly onto a wiring pattern (not shown) of circuit substrate 80 in recess 29, electronic component 73 may be mounted onto wiring pattern 40 formed in top surface (innermost surface) 29d.

Also, in a case where only electronic component 74 is mounted directly onto a wiring pattern. (not shown) of circuit substrate 80 in recess 29, wiring pattern 40 can be prevented from being formed in inner front surface 29b of recess 29.

Third Exemplary Embodiment

Next, a sensor module according to a third exemplary embodiment will be described with reference to FIG. 8.

Sensor module 10B according to the present exemplary embodiment basically has a configuration almost identical to that of sensor module 10 described in the above-described first exemplary embodiment. With regard to sensor module 10B according to the third exemplary embodiment, which is shown in FIG. 8, identical reference marks will be given to elements similar to those in sensor module 10 according to the first exemplary embodiment described with reference to FIG. 4, and description about those elements will be omitted occasionally.

Figure 8:
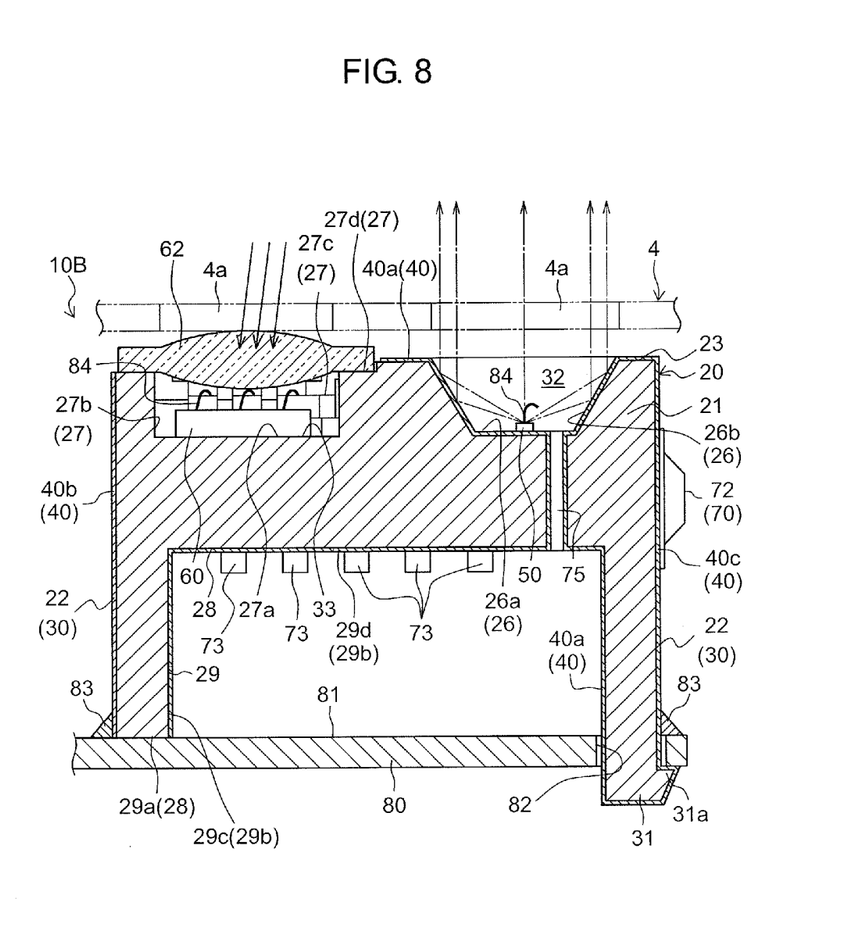
FIG. 8 is a cross-sectional view schematically showing a sensor module according to a third exemplary embodiment.

Sensor module 10B is formed by using three-dimensional circuit substrate 20 which is formed so as to be mountable onto circuit substrate (substrate) 80, as shown in FIG. 8.

Specifically, LED element (first photoelectric conversion element: sensor element) 50, light receiving element (second photoelectric conversion element: sensor element) 60, or the like is mounted onto an upper surface of three-dimensional circuit substrate 20, so that sensor module 10 functions as a proximity sensor.

Also, three-dimensional circuit substrate 20 includes base body 21 which has a three-dimensional solid shape including a recess part, and wiring pattern 40 formed in outer surface 22 of base body 21.

Then, outer surface 22 of base body 21 includes mounting surface 28 which faces circuit substrate (substrate) 80 when three-dimensional circuit substrate 20 is mounted onto circuit substrate (substrate) 80, and installation surface 23 which is different from mounting surface 28 and is a surface where an electronic component (LED element 50 or light receiving element 60) is installable.

Further, recess 29 is formed on a side where mounting surface 28 is provided in base body 21, and wiring pattern 40 is formed in installation surface 23 and inner front surface 29b of recess 29.

Also, electronic component 73 is mounted onto wiring pattern 40 formed in top surface (innermost surface) 29d.

In sensor module 10B according to the present exemplary embodiment, through hole 75 is formed in base body 21, and LED element 50 and electronic component 73 are electrically connected to each other via through hole 75.

It is noted that through hole 75 may be formed also on a side where light receiving element 60 is provided, or through holes 75 may be formed on both sides. Then, in a case where through holes 75 are formed on both sides, wiring pattern 40 need not be formed in outer side surface 30 of base body 21, or wiring pattern 40 may be formed in almost all of outer side surface 30 of base body 21, in order to improve shield effects.

The above-described present exemplary embodiment can produce effects and advantages which are similar to those in the above-described first exemplary embodiment.

Also, according to the present exemplary embodiment, LED element (sensor element) 50 and electronic component 73 are electrically connected to each other via through hole 75, so that a connection distance (a length of wiring pattern 40) between LED element (sensor element) 50 and electronic component 73 can be shortened. As a result, influences of ambient electromagnetic-wave noises can be more surely reduced, which promotes improvement in sensor precision.

Further, by forming wiring pattern 40 in almost all of outer side surface 30, it is possible to allow wiring pattern 40 to function as a shield layer, which promotes further improvement in sensor precision.

Though the preferred exemplary embodiments of the present disclosure have been described as above, the present disclosure is not limited to the above-described exemplary embodiments, and various modifications can be made.

For example, a configuration resulted from appropriate combination of the configurations shown in the above-described respective exemplary embodiments is practicable.

Also, though it has been described as one example in each of the above-described exemplary embodiments that all of plural kinds of photoelectric conversion elements are mounted onto a recess part formed in a base body, it will be sufficient if at least one photoelectric conversion element is mounted onto a recess part.

Also, a photometric sensor can be used in place of the first photoelectric conversion element in each of the above-described exemplary embodiments.

Also, the number or positions of light receiving parts of a light receiving element, the number or positions of light receiving parts of a photometric sensor, or the like, can be arbitrarily set.

Also, a configuration in which lens 62 is not included, is practicable in each of the above-described exemplary embodiments.

Also, the depth of a recess, the number of recesses, or the like can be appropriately set. Further, a notch or the like can be provided in a portion of the recess, in order to prevent a space formed when three-dimensional circuit substrate 20 is mounted onto circuit substrate (substrate) 80, from being enclosed.

Also, specifications (shape, size, layout, and the like) of a base body, a wiring pattern, and the other detailed parts can be appropriately modified.

REFERENCE MARKS IN THE DRAWINGS 10, 10A, 10B: sensor module
20: three-dimensional circuit substrate
21: base body
22: outer surface
23: installation surface
24: outer front surface
25, 29b: inner front surface
26: inner surface (LED-element-disposed inner surface)
27: inner surface (light-receiving-element-disposed inner surface)
28: mounting surface
29: recess
30: outer side surface
31: fitting protrusion (fitting part)
32: recess part (LED-element-disposed recess part)
33: recess part (light-receiving-element-disposed recess part)
40: wiring pattern
50: LED element (first photoelectric conversion element: sensor element)
60: light receiving element (second photoelectric conversion element: sensor element)
61, 61A, 61B, 61C, 61D: light receiving part
62: lens
73, 74: electronic component
80, 0.110, 180: circuit substrate (substrate)
82: fitting hole (fitted part)
83: solder

The invention claimed is:

1. A three-dimensional circuit substrate formed so as to be mountable onto a substrate, comprising:
a base body; and
a wiring pattern formed on an outer surface of the base body, wherein the outer surface of the base body includes:
    a mounting surface which faces the substrate when the three-dimensional circuit substrate is mounted onto the substrate; and
    an installation surface which is different from the mounting surface and is a surface where an electronic component is installable, and
  a first recess is formed on a first side where the mounting surface is provided in the base body
wherein
  the base body includes a fitting part which is formed so as to be fittable into a fitted part formed on the substrate.

2. The three-dimensional circuit substrate according to claim 1, wherein
the wiring pattern is formed on the installation surface and an inner front surface of the first recess.

3. The three-dimensional circuit substrate according to claim 1, wherein
a wiring pattern which is to be soldered to the substrate is formed in the fitting part.

4. The three-dimensional circuit substrate according to claim 1, wherein
the installation surface and the mounting surface overlap each other as viewed from a thickness direction of the substrate.

5. A sensor module including the three-dimensional circuit substrate according to claim 1.

6. The three-dimensional circuit substrate according to claim 1, wherein
a second recess is formed on a second side where the installation surface is provided in the base body, a photoelectric conversion element can be provided in the second recess and
a third recess is formed on the second side where the installation surface is provided in the base body, a light receiving element can be provided in the third recess.

7. The three-dimensional circuit substrate according to claim 1, further comprising:
a second recess formed on a second side where the installation surface is provided in the base body; and
a cover member covering the installation surface, the cover member including a translucent window covering the second recess.

8. A three-dimensional circuit substrate formed so as to be mountable onto a substrate, comprising:
a base body; and
a wiring pattern formed on an outer surface of the base body, wherein
the outer surface of the base body includes:
    a mounting surface which faces the substrate when the three-dimensional circuit substrate is mounted onto the substrate; and
    an installation surface which is different from the mounting surface and is a surface where an electronic component is installable, and
  a first recess is formed on a first side where the mounting surface is provided in the base body
  a second recess is formed on a second side where the installation surface is provided in the base body,
  the second recess is upwardly open, and has an approximately truncated-conical shape of which a diameter increases toward a top of the second recess.

9. The three-dimensional circuit substrate according to claim 8, wherein
a photoelectric conversion element can be provided in the second recess.

10. The three-dimensional circuit substrate according to claim 9, further comprising:
a cover member covering the second recess and the installation surface.

11. The three-dimensional circuit substrate according to claim 8,
wherein
the wiring pattern is formed on the installation surface and an inner front surface of the first recess.

12. The three-dimensional circuit substrate according to claim 8,
wherein
the base body includes a fitting part which is formed so as to be fittable into a fitted part formed on the substrate.

13. The three-dimensional circuit substrate according to claim 12,
wherein
a wiring pattern which is to be soldered to the substrate is formed in the fitting part.

14. The three-dimensional circuit substrate according to claim 8,
wherein
the installation surface and the mounting surface overlap each other as viewed from a thickness direction of the substrate.

15. A sensor module including the three-dimensional circuit substrate according to claim 8.

16. The three-dimensional circuit substrate according to claim 8, wherein
a third recess is formed on the second side where the installation surface is provided in the base body, and
a light receiving element can be provided in the third recess.

17. The three-dimensional circuit substrate according to claim 10, wherein the cover member includes a translucent window covering the second recess.

18. The three-dimensional circuit substrate according to claim 16, further comprising a cover member including a translucent window covering the second recess or the third recess.

* * * * *